United States Patent
Maruyama et al.

[11] Patent Number: 5,814,423
[45] Date of Patent: Sep. 29, 1998

[54] TRANSMISSION MASK FOR CHARGED PARTICLE BEAM EXPOSURE APPARATUSES, AND AN EXPOSURE APPARATUS USING SUCH A TRANSMISSION MASK

[75] Inventors: Shigeru Maruyama; Hiroshi Yasuda; Yoshihisa Ooaeh, all of Kawasaki, Japan

[73] Assignee: Fujitsu Limited, Kawasaki, Japan

[21] Appl. No.: 739,962

[22] Filed: Oct. 30, 1996

[30] Foreign Application Priority Data

Apr. 25, 1996 [JP] Japan .................................. 8-105137

[51] Int. Cl.⁶ ....................................................... G03F 9/00
[52] U.S. Cl. ............................ 430/5; 430/296; 250/492.3
[58] Field of Search ..................... 430/5, 296; 250/492.3

[56] References Cited

U.S. PATENT DOCUMENTS 5,254,417 10/1993 Wada ........................................ 430/5
5,376,802 12/1994 Sakamoto et al. ................. 250/492.23

*Primary Examiner*—S. Rosasco
*Attorney, Agent, or Firm*—Staas & Halsey

[57] ABSTRACT

A transmission mask for a charged particle beam exposure apparatus that includes a mask substrate having a plurality of apertures arrange in a matrix and a pair of deflection electrodes at each aperture on one surface of the mask substrate. A beam shield layer having a reflectivity to the charged particle beam greater than the mask substrate is positioned on the other surface of the mask substrate. The transmission mask is installed in the apparatus so that the beam shield layer is oriented towards the charged particle beam to prevent an increase in temperature due to irradiation of the charged particle beam.

22 Claims, 10 Drawing Sheets

TRANSMISSION MASK FOR CHARGED PARTICLE BEAM EXPOSURE APPARATUSES, AND AN EXPOSURE APPARATUS USING SUCH A TRANSMISSION MASK

BACKGROUND OF THE INVENTION

1. Field of the Invention

The present invention relates to a structure that improves the durability, relative to beam energy, of a transmission mask that is employed for a charged particle beam exposure apparatus.

2. Related Arts

An exposure method that employs a charged particle beam, such as an electron beam or an ion beam, has made it possible to perform fine machining of 0.05 $\mu$m with an accuracy of 0.02 $\mu$m. As a result of this accuracy, the exposure method has been adopted for use in the manufacture of highly integrated semiconductor devices. In the charged particle beam exposure method, however, in order to form a fine pattern while providing a high degree of accuracy, an enormous number of patterns must be exposed, and an increase in the exposure throughput is required.

As one means for improving the throughput, a block exposure method using a block mask, in which a plurality of transmission holes with repeated patterns are formed, has been proposed for producing a memory device, for example, in which a comparatively large number of repeated patterns are formed. Application of this method is difficult, however, for a device such as a logic circuit that has a comparatively large number of random patterns. Furthermore, there has been proposed, as a method for increasing throughput when random patterns are involved, an exposure method using a blanking aperture array (BAA) that provides simultaneous emission of a plurality of charged particle beams.

A blanking aperture array system (hereinafter referred to as a BAA system) employs a transmission mask in which an array of pixels are arranged in a matrix. A transmission hole and a pair of deflection electrodes near the hole are provided for each pixel.

FIG. 15 is a schematic cross sectional view of a transmission mask of the BAA system. A boron impurity region 11, a silicon oxide film 12, wiring and electrode 13, and silicon oxide films 14 and 15 are formed on a surface of a silicon substrate 10, with electrodes 16 through 19, each made of a thick plated layer of 30 $\mu$m, for example, are provided thereon. A grounded electrode 19 and a deflection electrode 18 are located opposite each other in the vicinity of apertures 20 that are arranged in a matrix shape, and formed in the silicon substrate 10. The silicon substrate 10 becomes a membrane-like structure by etching to remove its center, leaving only its periphery.

The grounded electrode 19 is connected to the grounded electrode pad 16 via the boron impurity region 11, and is grounded with the substrate 10. The deflection electrode 18 is connected via the wiring 13 to the electrode pad 17 to which individual control voltages are applied.

The transmission mask of the BAA system is mounted in an exposure apparatus, and is irradiated by a charged particle beam from the upper side in FIG. 15. With respect to the irradiation of the charged particle beam, deflection voltages V1 and V2 are applied between the grounded electrode 19 and the deflection electrode 18 on either side of each aperture 20 so that the direction of the beam transmitting through each aperture 20 is controlled as is shown in FIG. 15. As a result, the surface of a sample is irradiated with a pattern formed by a plurality of beams corresponding to selected pixels.

For a transmission mask of the BAA system, as many as five hundred and twelve apertures 20, for example, are formed in a matrix, and a deflection voltage is applied to each of the deflection electrodes 18 near the individual apertures 20, thus enabling the formation of arbitrary patterns by a plurality of pixel beams. Therefore, even when random patterns are included, the throughput for the exposure procedure can be increased in the BAA system.

However, since a BAA mask is a thin silicon substrate of 10 to 20 $\mu$m, it does not have a sufficient amount of durability. Further, it is necessary for the acceleration voltage of a charged particle beam to be raised in order to increase the resolution for an exposure pattern. Increasing the acceleration voltage of the charged particle beam enables a resist layer to be more linearly irradiated by the charged particle beam and improves the shape of the cross section of the exposed resist layer. When the acceleration voltage of the charged particle beam is raised, however, the energy of the charged particle beam irradiated to the silicon substrate is also increased. The heat generated by this increased energy melts the silicon substrate, and the durability required for practical application can not be obtained.

SUMMARY OF THE INVENTION

It is therefore one object of the present invention to provide a transmission mask having a structure that can resist the irradiation of a charged particle beam accelerated with high speed.

It is another object of the present invention to provide a charged particle beam exposure apparatus having a transmission mask for which adequate durability is ensured even when a high speed charged particle beam is used.

To achieve the above objects, according to the present invention, the following transmission mask for a charged particle beam exposure apparatus is provided. A plurality of apertures arranged in a matrix, along with paired deflection electrodes for each aperture, are formed in the mask substrate. A charged particle beam is irradiated toward, the plurality of apertures and the beam transmitting therethrough is controlled by the deflection electrodes. The deflection electrodes are formed on one surface of the mask substrate. A beam shield layer, having a reflectivity to the charged particle beam greater than that of the mask substrate is formed on the other surface of the mask substrate.

It is preferable that the beam shield layer be a heavy metal layer containing at least one of the heavy metals, such as gold, tantalum, or tungsten. Since the heavy metal layer is connected to the grounded deflection electrode, it is electrically stable in the exposure apparatus and does not cause a charge-up.

Further, to achieve the above objects, according to the present invention, a transmission mask includes a plurality of apertures arranged in a matrix, with paired deflection electrodes provided for each aperture, on one surface of a transmission mask substrate. A beam shield substrate having a plurality of apertures arranged at positions corresponding to the apertures of the transmission mask substrate includes a beam shield layer on one surface thereof. The beam shield layer has a charged particle beam reflectivity greater than that of the transmission mask substrate, with the other surface of the beam shield substrate bonded to the transmission mask substrate.

As was previously described, it is preferable that the beam shield layer be a layer of a heavy metal, and that it be connected to a grounded electrode in some manner.

In addition, to achieve the above objects, according to the present invention, a charged particle beam exposure apparatus, for irradiating a desired position of a sample with a charged particle beam formed into a predetermined shape, includes a beam generation means for generating the charged particle beam; beam deflection means for deflecting the charged particle beam; a sample stage which is provided downstream of the beam from the beam deflection means and on which the sample is mounted; and a transmission mask installed between the beam generation means and the beam deflection means. The transmission mask has a plurality of apertures that are arranged in a matrix, and paired deflection electrodes provided for each of the apertures on the one surface. The paired deflection electrodes are made of at least one of such heavy metals as gold, tantalum and tungsten. The transmission mask is installed in the apparatus so that the deflection electrodes are oriented toward the beam generation means.

Since a transmission mask of the BAA system is so designed that deflection electrodes are formed across the entire surface of the mask substrate in a crowded manner, the durability of the transmission mask can be increased by forming the electrodes with a material, such as a heavy metal, having a high beam reflectivity, and by installing the transmission mask in the apparatus so that the face of the deflection electrodes is oriented toward the beam generation means.

DETAILED DESCRIPTION OF THE PREFERRED EMBODIMENTS

The preferred embodiments of the present invention will now be described while referring to the accompanying drawings. It should be noted, however, that the technical scope of the invention is not limited to the embodiments.

According to a first aspect of the present invention, grounded electrodes and deflection electrodes are formed on one surface of a transmission mask of the BAA type in a crowded manner. These electrodes are made of a heavy metal, such as gold, tungsten or tantalum, and the face formed in the electrodes is oriented against the direction in which a charged particle beam is irradiated. With this structure, the conventional problem of heat generated by a high speed beam can be resolved. Since the reflectivity of the heavy metal relative to the charged particle beam is greater than silicon, etc., a rise in temperature due to the absorption of beam energy can be prevented. Since gold especially has a thermal conductivity higher than silicon, the heat release effect is greatly enhanced and a rise in the temperature can be prevented.

According to a second aspect of the present invention, a heavy metal layer is formed on the surface of a silicon substrate that is opposite to the surface of the electrodes. The transmission mask is installed so that the face of the electrodes is oriented toward the downstream portion of the projected beam, as in the conventional manner. Similarly to the above described case, since the heavy metal layer reflects a beam, and also has a high thermal conductivity, a rise in the temperature can be prevented. It should be noted that since the conductive heavy metal layer is located in the vicinity of the deflection electrodes for blanking control, the heavy metal layer must be grounded in some manner so as not to affect an electric field of the deflection electrodes.

According to a third aspect of the present invention, a protective silicon substrate on which a heavy metal layer is deposited is bonded to a conventional transmission mask of the BAA type. For this protective substrate, it is necessary to form openings at the pixels and the electrode pad of the transmission mask and to have a heavy metal layer to be grounded.

Figure 1:
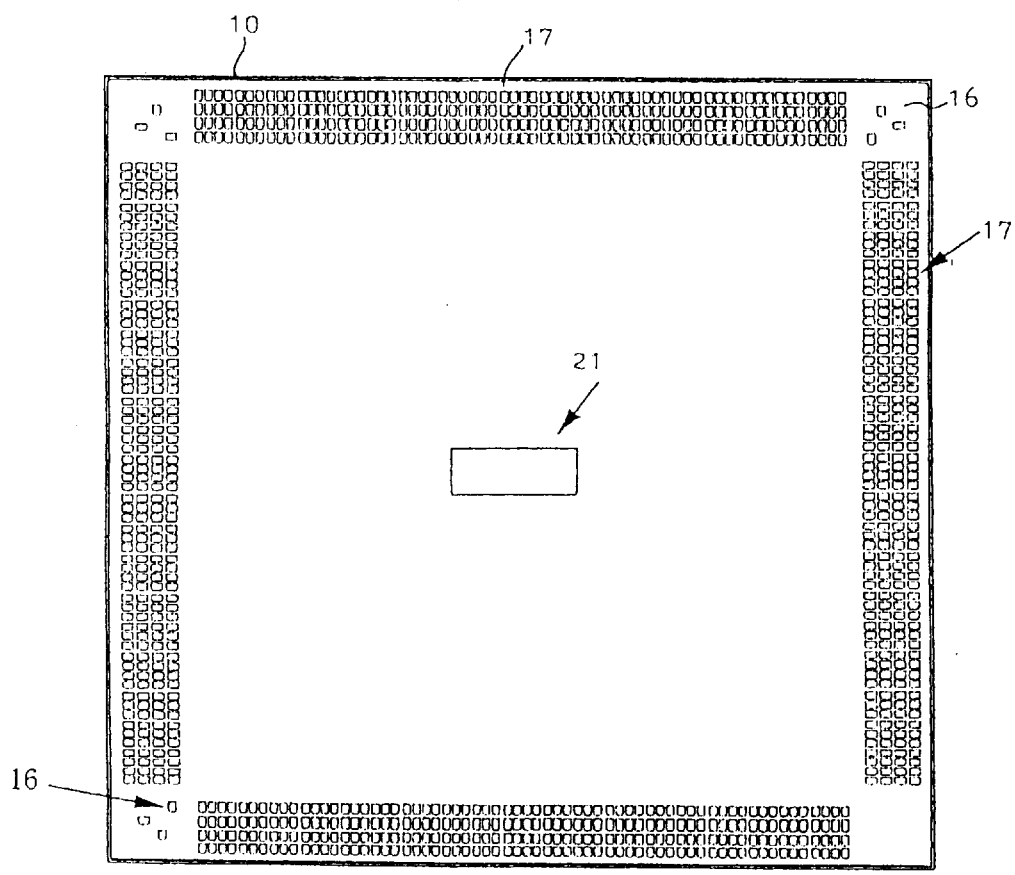
FIG. 1 is a plan view of a complete transmission mask of a BAA type.

FIG. 1 is a plan view of a whole transmission mask of the BAA type. An array of deflection electrode pads 17, in a number equivalent to an aperture count, are formed on the peripheral area of a membrane structure constituted by a silicon substrate 10. A grounded electrode pad 16 is provided at each corner of the membrane for connection of grounded electrodes. An aperture region 21 in which, for example, 512 apertures are formed in a matrix manner is located in the center of the membrane.

Figure 2:
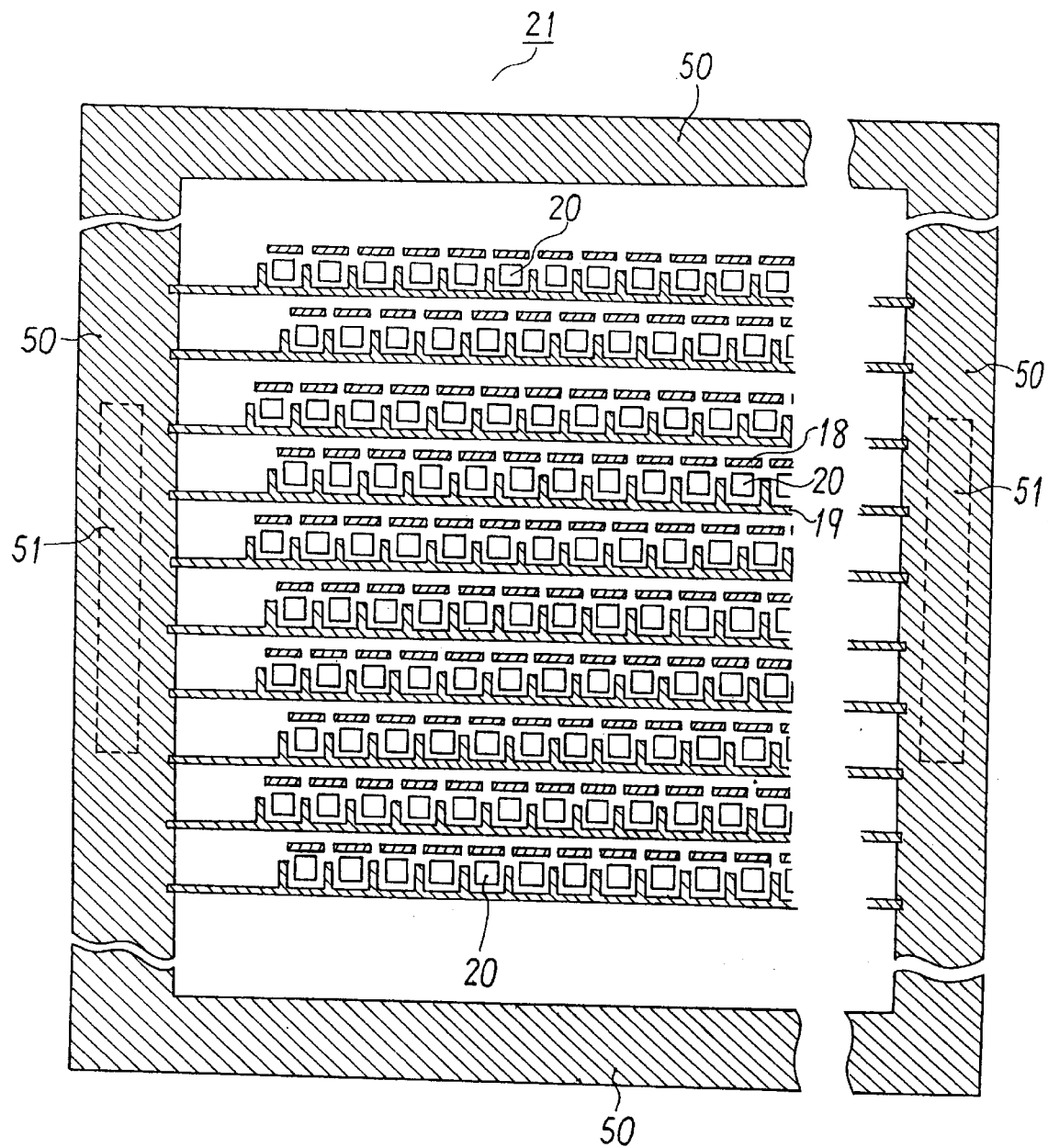
FIG. 2 is a partially enlarged plan view of an aperture region.

FIG. 2 is a partially enlarged plan view of the aperture region 21. As is shown in FIG. 2, apertures 20 are arranged in a matrix as a unit of pixels. A grounded electrode 19 a surrounding three sides of the aperture 20, and a deflection electrode 18 located opposite thereto are provided for each aperture 20. Since the grounded electrodes 19 can be provided in common for all the apertures 20, they have a shape that resembles the teeth of a comb, as is shown in FIG. 2. A gold metal plated layer 50 provided around the aperture array, is connected to all ground electrodes 19 and the Si substrate 10 through contact holes 51, shown by dotted lines, to avoided a charge-up through electron beam irradiation. The deflection electrodes 18 are respectively connected to the deflection electrode pads 17 shown in FIG. 1 by means of electrically separated wiring layers (not shown).

The grounded electrodes 19 and the deflection electrodes 18 are so formed to have a thickness great enough to deflect the transmitting charged particle beam. More specifically, the dimensions of each electrode are determined so that the faces of the grounded electrodes 19 and the deflection electrodes 18 opposite each other are sufficiently large to provide the electric fields required for beam deflection.

Figure 15:
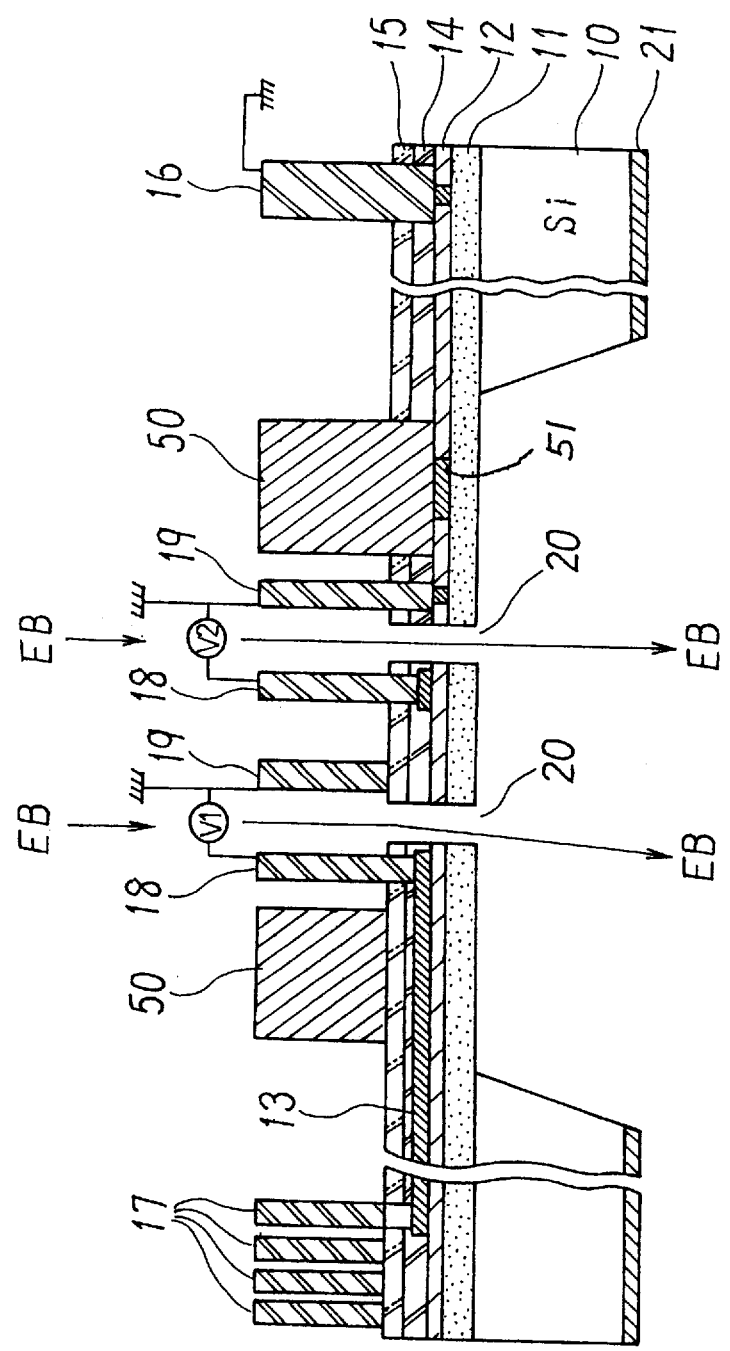
FIG. 15 is a cross sectional view of a conventional transmission mask.

FIGS. 3 through 10 are cross sectional views of the procedures for manufacturing a transmission mask of the BAA type according to the present invention. These cross section does not include some element, such as metal layer 51. However, the detail structure is the same as FIG. 15 except for the present invention. The manufacturing procedures will now be described while referring to FIGS. 3 through 10.

Figure 3:
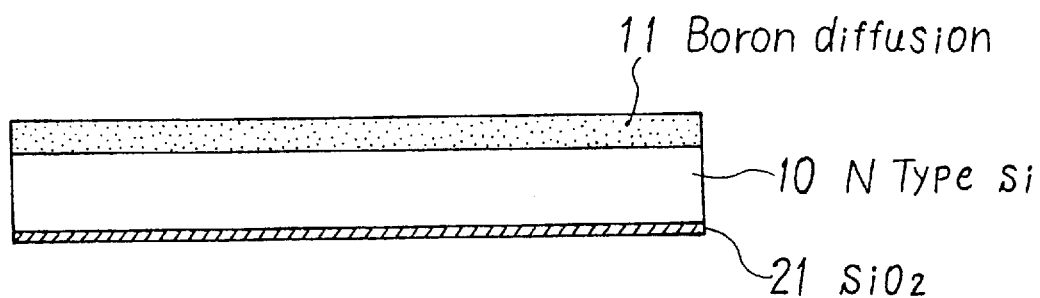
FIG. 3 is a cross sectional view for a procedure employed for manufacturing a transmission mask of the BAA type according to a first embodiment of the present invention.

As is shown in FIG. 3, a polyboron film coat is applied to the surface of an N silicon substrate 10, on the reverse surface of which is deposited a thermal oxide film 21 of 5000 Å. The substrate 10 is annealed and boron is diffused in the substrate 10 to form a deep boron diffusion layer 11 of approximately 15 $\mu$m. The boron diffusion layer 11 serves as an etching stopper for a later process during which etching is performed on the silicon substrate 10, from the reverse surface, to provide a membrane structure. A boron concentration more than $10^{20}/cm^3$ for example is therefore required.

Figure 4:
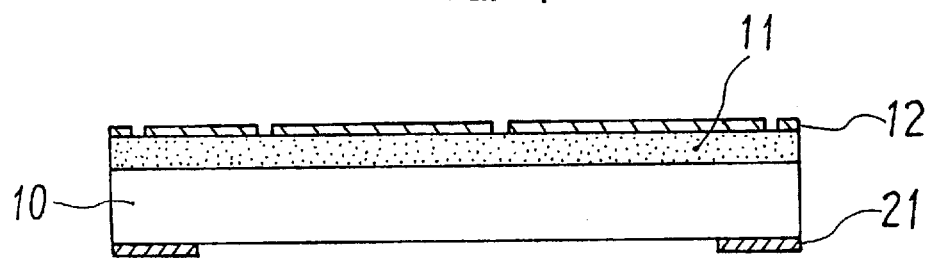
FIG. 4 is a cross sectional view for a procedure employed for manufacturing the transmission mask of the BAA type according to the first embodiment of the present invention.

A thick thermal oxide film 12 of 8500 Å, for example, is then deposited, as shown in FIG. 4. The thermal oxide film 12 is made as thick as possible in order to reduce a crosstalk between electrodes formed later and the substrate as much as possible. A portion of the oxide film 21 on the reverse surface of the silicon film 10 is then removed, using the reactive ion etching method (RIE method), so as to expose the substrate surface for the formation of the membrane. And in addition, a portion of the oxide film 12 on the obverse surface of the substrate 10 is also removed to expose the surface for grounded electrodes. The boron diffusion layer is later grounded therethrough.

Figure 5:
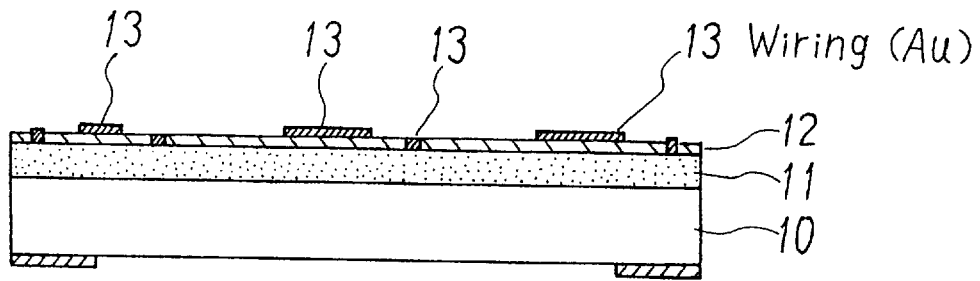
FIG. 5 is a cross sectional view for a procedure employed for manufacturing the transmission mask of the BAA type according to the first embodiment of the present invention.

A wiring layer 13 is then formed as shown in FIG. 5. The wiring layer 13 is formed by using the vacuum evaporation method to laminate a tantalum-molybdenum (TaMo) layer, a gold layer and a tantalum-molybdenum layer having the respective thicknesses of, for example, 300 Å, 4500 Å and 300 Å. Etching of the layer 13 is then performed, using the ion milling method, to shape the layer 13 with a predetermined pattern. The tantalum-molybdenum layer is formed because it provides improved adhesion contact.

Figure 6:
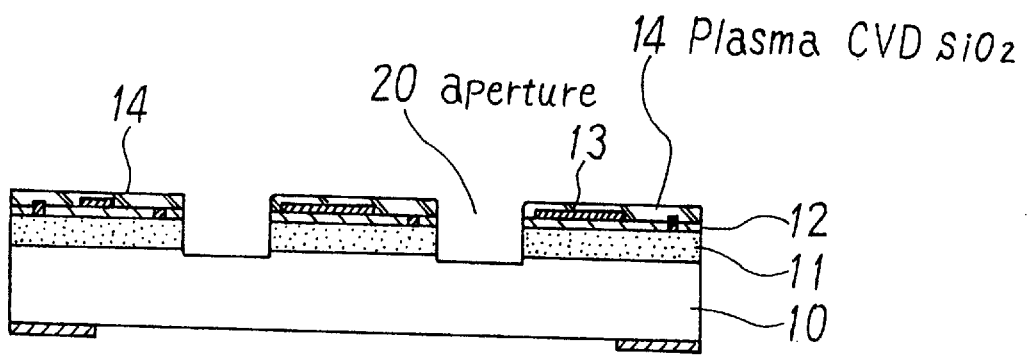
FIG. 6 is a cross sectional view for a procedure employed for manufacturing a transmission mask of the BAA type according to the first embodiment of the present invention.

As is shown in FIG. 6, an oxide film 14 of, for example, 15000 Å is deposited on the obverse side of the substrate using the plasma CVD method, and the portions of the oxide film 14 corresponding to the apertures 20 are removed using the RIE method. Following this, the boron diffusion layer 11 under the oxide film 14 is etched by the RIE method using $cl_2$. During this etching process, since the selection ratio relative to the silicon oxide film 14 is not very high, some etching of the silicon oxide film 14 on the obverse surface also occurs.

Figure 7:
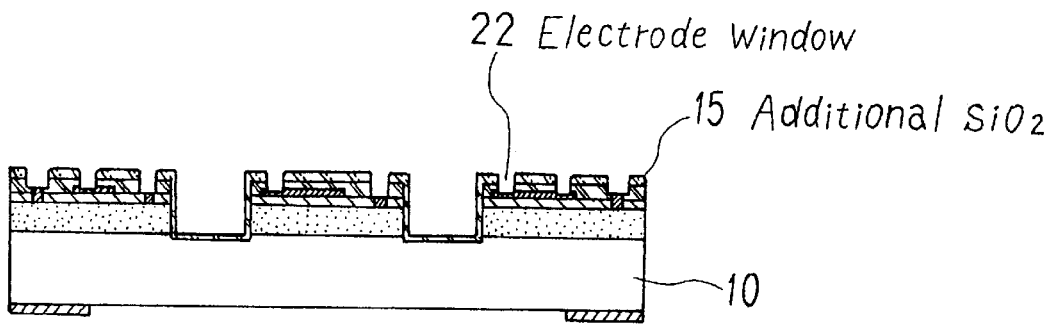
FIG. 7 is a cross sectional view for a procedure employed manufacturing the transmission mask of the BAA type according to the first embodiment of the present invention.

In addition, as is shown in FIG. 7, an oxide film 15 is formed using the plasma CVD method on the silicon oxide film 14 which was etched above so as to provide the oxide film 15 with a total thickness of 10000 Å. The silicon oxide films 14 and 15 are etched using the RIE method, while employing a predetermined resist pattern, to form electrode windows 22 for plating. The electrode windows 22 are located in areas at which deflection electrodes, grounded electrodes, and their electrode pads will be formed later.

Figure 8:
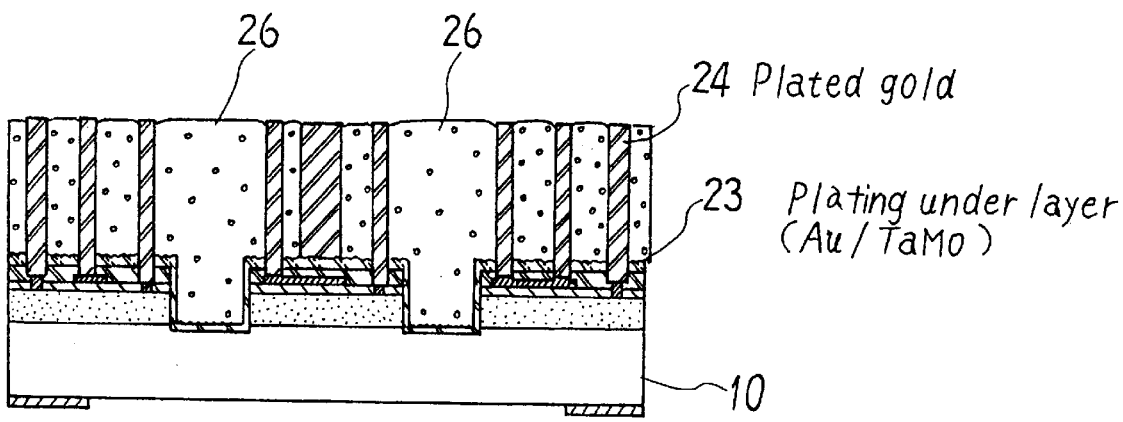
FIG. 8 is a cross sectional view for a procedure employed manufacturing the transmission mask of the BAA type according to the first embodiment of the present invention.

Following this, as is shown in FIG. 8, gold and tantalum-molybdenum (TaMo alloy) layers of, for example, 500 Å and 2000 Å are deposited by vacuum evaporation as a plating underlayer 23. Thus, the plating underlayer 23 covers almost the entire surface of the substrate 10. Then, a resist layer 26 is formed on the plating underlayer 23 and removed at the areas of the electrode windows 22. While the resultant substrate is immersed in a plating liquid, for example, Newtronecs 309 (a product name of EEJA Co., Ltd.), a current is supplied to the plating underlayer 23. As a result, thick gold plated electrodes 24 are formed only at the electrode windows 22. The thickness of the plated electrodes 24 is about 30 $\mu$m, for example, so as to be adequate for beam deflection.

Figure 9:
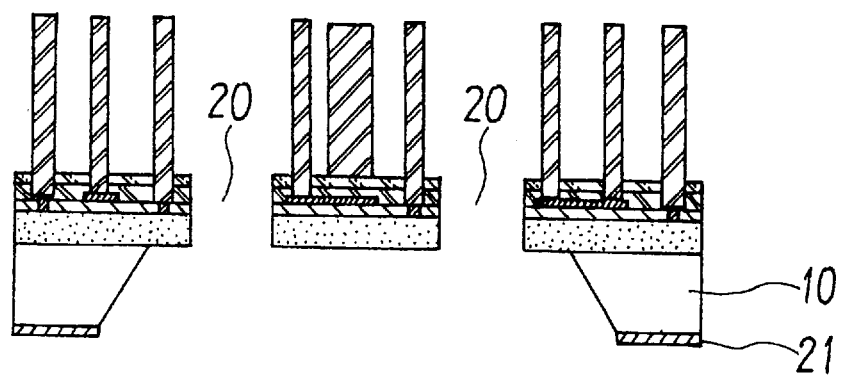
FIG. 9 is a cross sectional view for a procedure employed for manufacturing the transmission mask of the BAA type according to the first embodiment of the present invention.

Finally, as is shown in FIG. 9, the silicon substrate 10 is removed using anisotropic etching, while employing the oxide film 21 as a mask, to form a membrane structure. This etching is performed by immersing the substrate in a liquid mixture of ethylenediamine, pyrocatechol and water. The plating underlayer 23 at the bottom of the apertures 20 is also removed at the same time. Further, the plating underlayer 23 remaining on the obverse surface is removed using the RIE method. The gold layer thereof is removed using the RIE method using Ar gas, for example, while the tantalum-molybdenum layer is removed by the RIE method using a gas mixture of $CF_4$ and $O_2$. According to the first embodiment of the present invention, the produced transmission mask is installed in an exposure apparatus with gold plated electrodes 24 oriented toward the upstream portion of the projected beam.

Figure 10:
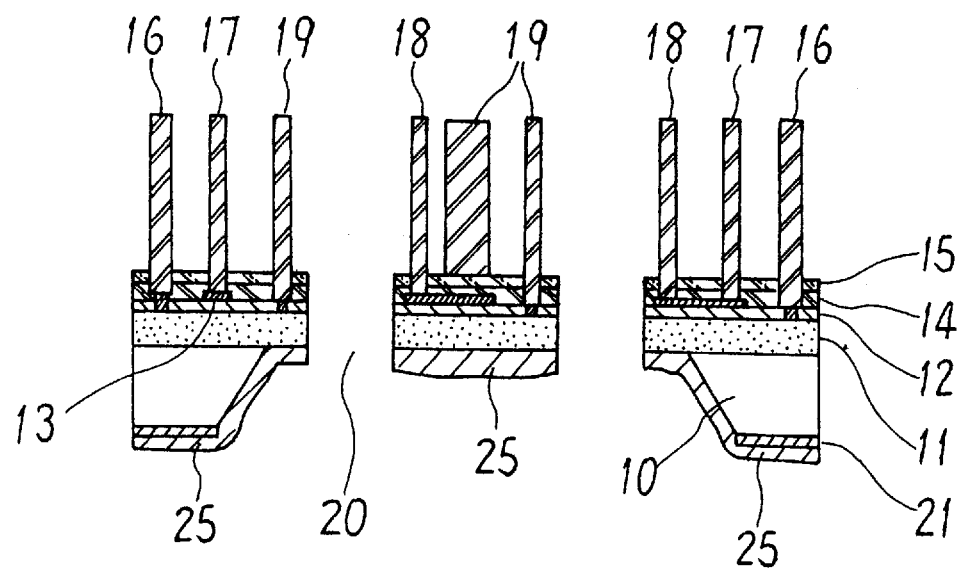
FIG. 10 is a cross sectional view for a procedure employed for manufacturing a transmission mask of the BAA type according to a second embodiment of the present invention.

According to a second embodiment of the present invention, in addition to the previously described manufacturing procedures, a thick, heavy metal layer 25 of 1 $\mu$m is formed across the entire surface of the membrane silicon substrates 10 and 11, as shown in FIG. 10. The heavy metal layer 25 comprises tungsten (W), tantalum (Ta) or gold (Au), and is formed by sputtering or by vacuum evaporation. Since the reflectivity of the heavy metal layer 25 relative to a charged particle beam is higher than that of silicon, a transmission mask is attached to a mirror barrel of an exposure apparatus so that the heavy metal layer 25 is oriented toward the upstream portion of the projected beam. Furthermore, since the heavy metal layer 25 directly contacts the boron diffusion layer 11, they are mutually grounded.

A third embodiment of the present invention will now be described.

Figure 11:
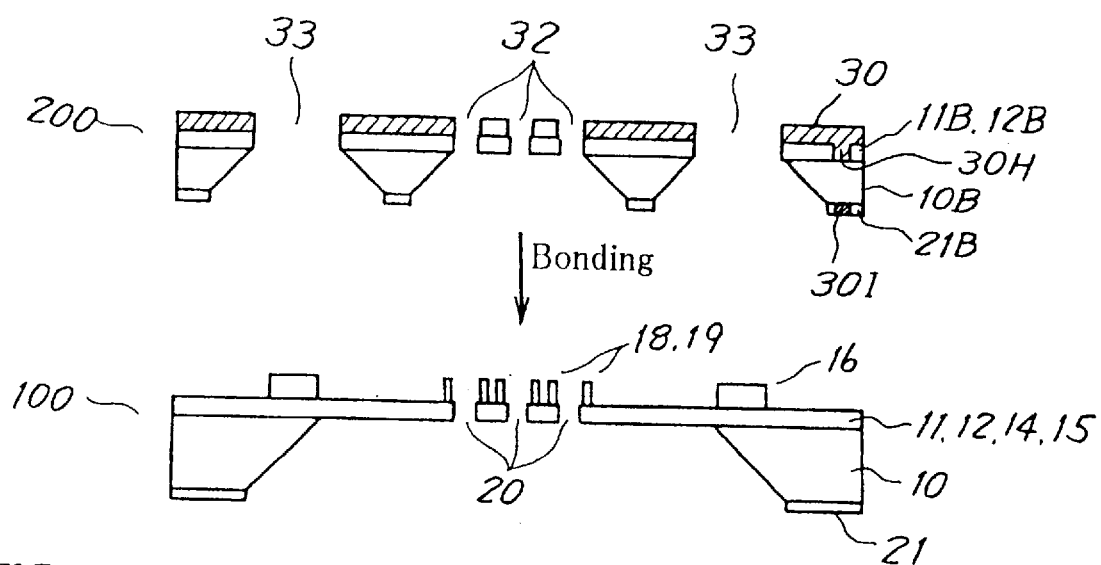
FIG. 11 is a cross sectional view for a manufacturing procedure according to a third embodiment of the present invention.

In addition to a transmission mask substrate 100 fabricated by the procedures shown in FIGS. 3 through 9, a second substrate 200, on the surface of which a heavy metal layer 30 composed of, for example, gold, is deposited, is prepared as is shown in FIG. 11. The second substrate 200 is fabricated using the same procedures as those explained while referring to FIGS. 3 through 9. Since a wiring layer 13 and gold plated electrodes are not formed, the procedures for forming them are omitted. A boron diffusion layer 11 and an oxide film 12 are formed at the surface of a silicon substrate 10, the apertures 32, 33 are formed by etching from the oxide layer 12, and finally, anisotropic etching is performed by immersing the silicon substrate 10 in an etching liquid to form penetrating apertures. A thick, heavy metal layer 30 of about 1 μm of gold, for example, is formed by sputtering or by vacuum evaporation.

The heavy metal layer 30 must be grounded. While various grounding methods can be used, one method for grounding the heavy metal layer 30 is to ground the layer 30 by a probe when a transmission mask is installed in an exposure apparatus. And another method involves the connection of the heavy metal layer 30 to a grounded electrode on the side of the transmission mask substrate 100 to which it is to be bonded. In the example in FIG. 11, the through holes 30H and 30I are respectively formed in the obverse surface and the reverse surface of the second substrate 200, so that the heavy metal layer 30 is connected to the boron diffusion layer 11 on the transmission mask substrate 100 via the through holes 30H and 30I and an N silicon substrate 10B.

Apertures 32 are formed corresponding to the apertures 20 for the pixels in the transmission mask substrate 100, and apertures 33 are formed corresponding to the electrode pads 16. Then, as is shown in FIG. 11, the second substrate 200 is bonded to the transmission mask substrate 100.

Figure 12:
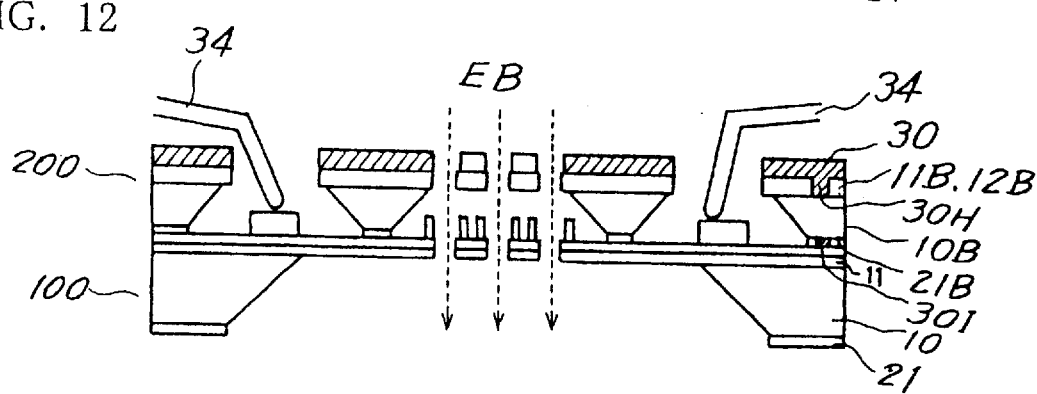
FIG. 12 is a cross sectional view of the structure of the transmission mask according to the third embodiment of the present invention.

FIG. 12 is a cross sectional view of a transmission mask obtained by bonding the two substrates 100 and 200 together. Although in the example in FIG. 12 the second substrate 200 for shielding is bonded to the electrode forming face of the transmission mask substrate 100, it may be bonded to the opposite surface thereof. The transmission mask is installed in the mirror barrel of the exposure apparatus so that the second shielding substrate 200 is oriented toward the upstream portion of a charged particle beam.

Figure 13:
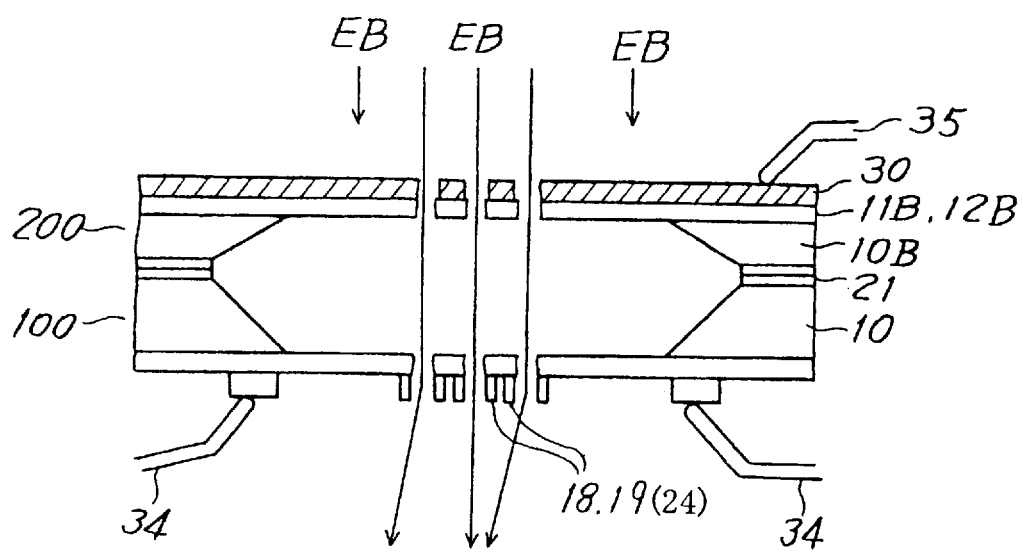
FIG. 13 is a cross sectional view of a modification of the structure of the transmission mask according to the third embodiment of the present invention.

FIG. 13 illustrates a modification of the third embodiment. In this modification, a second substrate 200 for beam shielding having a metal heavy layer 30 formed thereon is bonded to a surface of the transmission mask substrate 100 opposite to the surface on which electrodes 18 and 19 are formed. With this structure, the face of the transmission mask substrate 100 on which the electrodes 18 and 19 are formed is shielded from the beam by heavy metal electrodes 24 as shown in FIG. 9. In the same manner, the face of the second substrate 200 opposite to the above face is also shielded from the beam by a heavy metal electrode 30.

Since, in the mirror barrel of the exposure apparatus, a beam is emitted from the electron gun for irradiation and reflected electrons and secondary electrons are also generated in random directions, regardless of the beam direction, the protection of both faces of the BAA transmission mask very effective for improving its durability. In the example in FIG. 13, the heavy metal layer 30 on the second substrate 200 is grounded by a probe 35.

Figure 14:
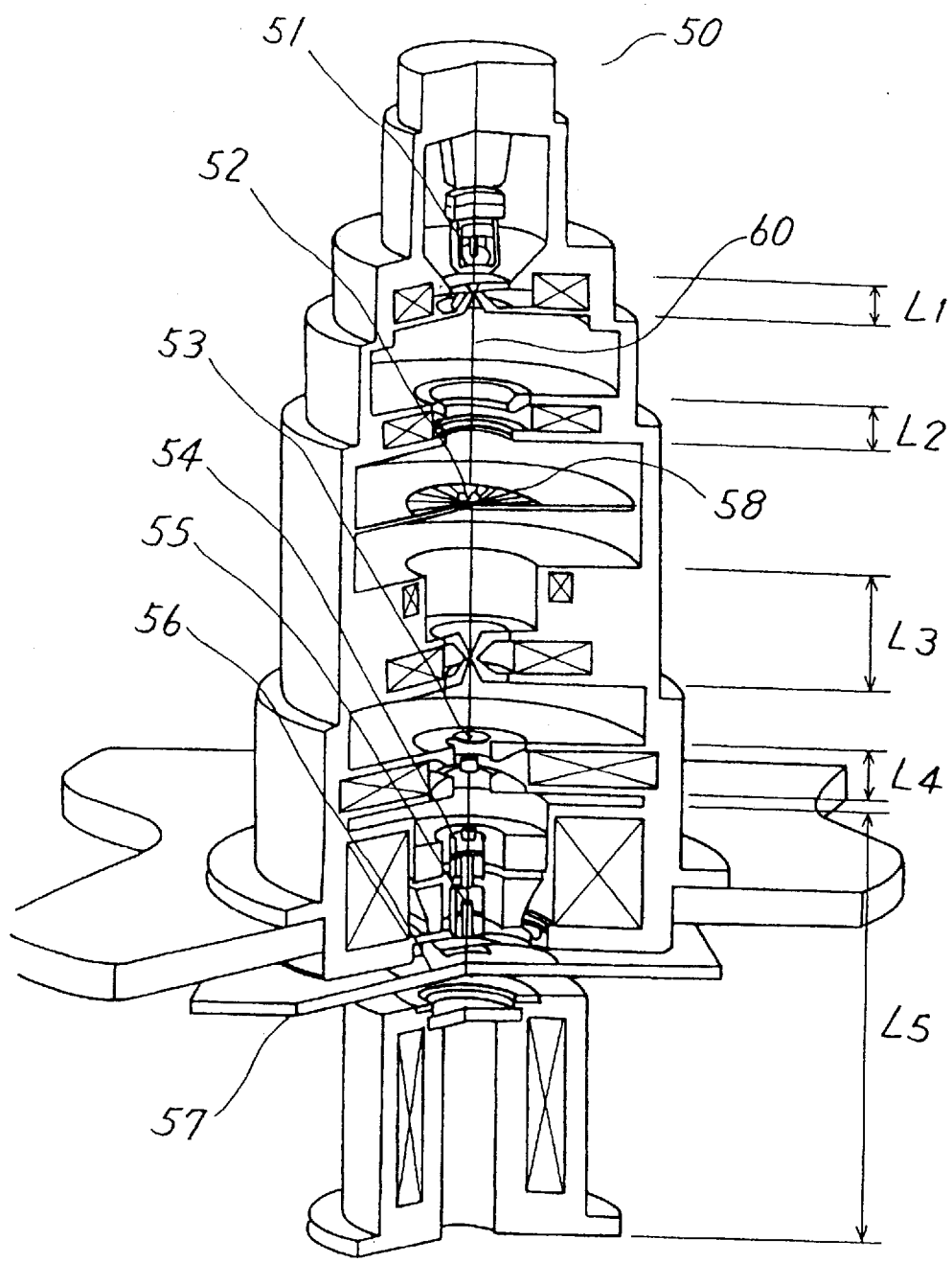
FIG. 14 is a schematic diagram illustrating a mirror barrel for explaining the condition when a transmission mask of the BAA type is installed in an exposure apparatus.

FIG. 14 is a schematic diagram illustrating a mirror barrel 50 for explaining the condition wherein the BAA transmission mask is installed in the exposure apparatus. An electron gun 51 is located at the upper portion of the mirror barrel 50, and an electron beam travels in the vicinity of an optic axis 60 of the optical system. A BAA transmission mask 52 is irradiated by the beam. On the transmission mask 52, electrode pads are provided in an equivalent number of deflection electrodes, as was described above. The electrode pads are connected to a probe 58 to control the deflection electrodes. As a result, the beam projected through the transmission mask 52 becomes a flux of plural beams for a plurality of pixels so that a desired exposure pattern is provided.

The beam flux is projected through a lens L3, a round aperture 53 corresponding to a diaphragm, and a lens L4, and is deflected by a main deflector 54 and a sub-deflector 55 inside the projection lens L5 so that the beam flux strikes a desired position on a wafer 56 mounted on a stage 57.

In the first embodiment of the present invention, the BAA transmission mask having the grounded and deflection electrodes made of the heavy metal gold is attached to the mirror barrel shown in FIG. 14 so that its electrode formation surface is oriented in the upward direction. As a result, shielding from the electron beam emitted by the electron gun 51 is provided by the crowdedly provided heavy metal electrodes, and a rise in the temperature of the mask substrate is prevented.

As is explained above, according to the present invention, the electrodes on the BAA transmission mask substrate are plated with a heavy metal layer including gold, for example, and the transmission mask is attached so that its electrode forming surface is oriented in the direction against the beam irradiation. Thus, the raising of the temperature of the transmission mask substrate due to beam energy is prevented.

A heavy metal layer including gold, for example, is formed on the surface of the BAA transmission mask opposite to the electrode forming surface, and thus heavy metal layers are formed on both sides of the silicon substrate. With this structure, the raising of the temperature due to the energy contained in a charged particle beam can be prevented.

Further, in the same process for manufacturing the BAA transmission mask, a heavy metal layer including gold, for example, is formed on the surface of the second substrate in which a plurality of apertures are formed, and the second substrate is bonded to the BAA transmission mask. With this structure, the transmission mask can be protected from a charged particle beam by the second substrate having the heavy metal layer.

In any of the above described cases, a rise in the temperature occasioned by irradiation of a charged particle beam can be prevented, and the durability of the transmission mask can be improved.

What we claim is:

1. A transmission mask for a charged particle beam exposure apparatus comprising:

a mask substrate having a first surface and a second surface, the first surface having a plurality of apertures arranged in a matrix and a pair of deflection electrodes provided at each aperture, the charged particle beam being irradiated to the plurality of apertures and being controlled by the deflection electrodes; and a beam shield layer, having a reflectivity to the charged particle beam greater than the mask substrate, provided on the second surface of the mask substrate.

2. A transmission mask of claim 1 wherein said beam shield layer includes a heavy metal from the group consisting of gold, tantalum, and tungsten.

3. A transmission mask of claim 2, wherein an electrode of the pair of deflection electrodes is a ground electrode and said beam shield layer is electrically connected to the ground electrode.

4. A transmission mask of claim 1, wherein said deflection electrodes includes a heavy metal material from the group consisting of gold, tantalum, and tungsten.

5. A transmission mask of claim 4, wherein an electrode of the pair of deflection electrodes is a ground electrode and said beam shield layer is electrically connected to the ground electrode.

6. A transmission mask of claim 1, wherein a deflection electrode of the pair of deflection electrodes is a ground electrode and said beam shield layer is electrically connected to the ground electrode.

7. A transmission mask for a charged particle beam exposure apparatus comprising:

a transmission mask substrate having a first surface that has a plurality of apertures arranged in a matrix and a pair of deflection electrodes provided at each aperture;

a beam shield substrate having a first surface and a second surface, with a plurality of apertures provided at positions corresponding to the apertures of the transmission mask substrate; and a beam shield layer, provided on the first surface of the beam shield substrate, having a charged particle beam reflectivity greater than the transmission mask substrate, wherein the second surface of the beam shield substrate is bonded to the transmission mask substrate.

8. A transmission mask of claim 7, wherein the transmission mask substrate has a second surface, and the second surface of the beam shield substrate is bonded to the second surface of the transmission mask substrate.

9. A transmission mask of claim 8, wherein said beam shield layer includes a heavy metal material from the group consisting of gold, tantalum, and tungsten.

10. The transmission mask of claim 9, wherein a deflection electrode of the pair of deflection electrodes on the mask substrate is a ground electrode, and said beam shield layer is electrically connected to the ground electrode.

11. A transmission mask of claim 8, wherein said deflection electrodes includes a heavy metal material from the group consisting of gold, tantalum, and tungsten.

12. The transmission mask of claim 11, wherein a deflection electrode of the pair of deflection electrodes on the mask substrate is a ground electrode, and said beam shield layer is electrically connected to the ground electrode.

13. A transmission mask of claim 8, wherein a deflection electrode of the pair of deflection electrodes on the mask substrate is a ground electrode, and said beam shield layer is electrically connected to the ground electrode.

14. A transmission mask of claim 7, wherein said beam shield layer includes a heavy metal material from the group consisting of gold, tantalum, and tungsten.

15. The transmission mask of claim 14, wherein a deflection electrode of the pair of deflection electrodes on the mask substrate is a ground electrode, and said beam shield layer is electrically connected to the ground electrode.

16. A transmission mask of claim 7, wherein said deflection electrodes includes a heavy metal material from the group consisting of gold, tantalum, and tungsten.

17. The transmission mask of claim 16, wherein a deflection electrode of the pair of deflection electrodes on the mask substrate is a ground electrode, and said beam shield layer is electrically connected to the ground electrode.

18. A transmission mask of claim 7, wherein a deflection electrode of the pair of deflection electrodes on the mask substrate is a ground electrode, and said beam shield layer is electrically connected to the ground electrode.

19. A charged particle beam exposure apparatus for irradiating a desired position of a sample with a charged particle beam formed into a predetermined shape and having a downstream portion, the apparatus comprising:

beam generation means for generating the charged particle beam;

beam deflection means for deflecting the charged particle beam;

a sample stage provided at the downstream portion of the charged particle beam from the beam deflection means to mount said sample; and a transmission mask installed between the beam generation means and the beam deflection means, said transmission mask having a surface that includes a plurality of apertures arranged in a matrix and a pair of deflection electrodes provided at each aperture, said deflection electrodes including a heavy metal material from the group consisting of gold, tantalum, and tungsten, wherein the surface of the transmission mask is oriented toward the beam generation means.

20. A charged particle beam exposure apparatus for irradiating a desired position of a sample with a charged particle beam formed into a predetermined shape and having a downstream portion, the apparatus comprising:

beam generation means for generating the charged particle beam;

beam deflection means for deflecting the charged particle beam;

a sample stage provided at the downstream portion of the charged particle beam from the beam deflection means to mount said sample; and a transmission mask installed between the beam generation means and the beam deflection means, said transmission mask comprising:

a transmission mask substrate having a surface with a plurality of apertures arrange in a matrix, and a pair of deflection electrodes provided at each apertures; and a beam shield substrate having a first surface and a second surface, with the first surface having a plurality of apertures provided at positions corresponding to the apertures of the transmission mask substrate and a heavy metal layer, including at least one heavy metal material from the group consisting of gold, tantalum, and tungsten, the second surface of the beam shield substrate being bonded to said transmission mask substrate, wherein the first surface is oriented toward the beam generation means.

21. A charged particle beam exposure apparatus of claim 20, wherein said deflection electrodes include a heavy metal material from the group consisting of gold, tantalum, and tungsten.

22. A transmission mask for a charged particle beam exposure apparatus comprising:

a mask substrate having a surface with a plurality of apertures arranged in a matrix; and a pair of deflection electrodes provided at each aperture on the surface of the mask substrate, said deflection electrodes including a heavy metal material from the group consisting of gold, tantalum, and tungsten, wherein a charged particle beam is irradiated to the plurality of apertures and controlled by the deflection electrodes.

* * * * *